United States Patent
Wu et al.

(10) Patent No.: US 10,772,205 B1
(45) Date of Patent: Sep. 8, 2020

(54) CIRCUIT BOARD, SEMICONDUCTOR DEVICE INCLUDING THE SAME, AND MANUFACTURING METHOD THEREOF

(71) Applicant: Taiwan Semiconductor Manufacturing Co., Ltd., Hsinchu (TW)

(72) Inventors: Jiun-Yi Wu, Taoyuan (TW); Chien-Hsun Lee, Hsin-chu County (TW); Chen-Hua Yu, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/285,220

(22) Filed: Feb. 26, 2019

(51) Int. Cl.
  *H05K 1/02* (2006.01)
  *H05K 3/46* (2006.01)
  *H05K 1/11* (2006.01)
  *H01L 23/538* (2006.01)
  *H05K 3/14* (2006.01)
  *H05K 1/14* (2006.01)

(52) U.S. Cl.
  CPC .......... *H05K 1/115* (2013.01); *H01L 23/5384* (2013.01); *H05K 1/0298* (2013.01); *H05K 1/144* (2013.01); *H05K 3/146* (2013.01); *H05K 3/4647* (2013.01); *H05K 2201/0959* (2013.01)

(58) Field of Classification Search
  CPC ... H05K 1/0298; H05K 1/0296; H05K 3/4647
  See application file for complete search history.

(56) References Cited

U.S. PATENT DOCUMENTS

| | | | | |
|---|---|---|---|---|
| 4,963,697 A | * | 10/1990 | Peterson | H05K 1/0207 174/252 |
| 8,913,401 B2 | * | 12/2014 | Iguchi | H05K 1/0243 174/262 |
| 2003/0133279 A1 | * | 7/2003 | Shirasaki | H01P 1/047 361/795 |
| 2007/0230151 A1 | * | 10/2007 | Hayashi | H05K 1/162 361/795 |
| 2015/0257261 A1 | * | 9/2015 | Kitagawa | H05K 1/0298 361/688 |
| 2016/0095224 A1 | * | 3/2016 | Chen | H05K 3/4697 361/746 |

* cited by examiner

*Primary Examiner* — Jeremy C Norris
(74) *Attorney, Agent, or Firm* — JCIPRNET

(57) ABSTRACT

A structure, a semiconductor device and a manufacturing method thereof are provided. The structure includes a core layer and a build-up stack disposed on the core layer. The core layer includes a first core dielectric layer, a second core dielectric layer, through vias, and a patterned conductive plate. The second core dielectric layer is disposed on the first core dielectric layer. The through vias cross the first core dielectric layer and the second core dielectric layer. The patterned conductive plate is disposed on the first core dielectric layer and is electrically insulated from the through vias. The build-up stack includes interconnected conductive patterns electrically connected to the through vias. A bottom surface of the patterned conductive plate is coplanar with an interface of the first core dielectric layer and the second core dielectric layer.

20 Claims, 12 Drawing Sheets

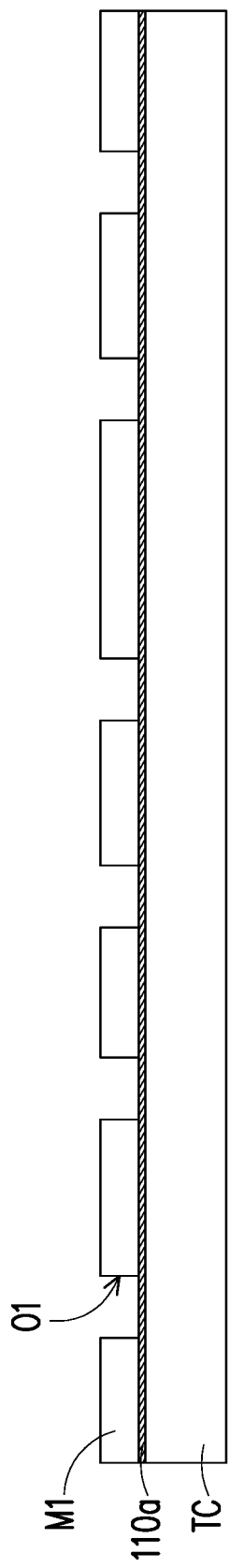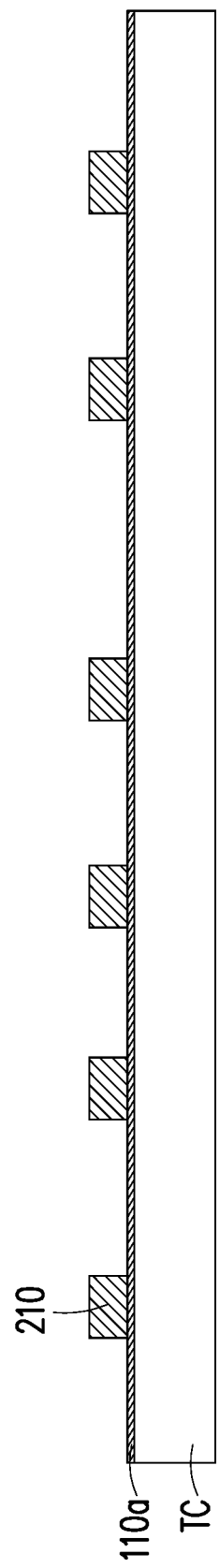

us 10,772,205 B1

CIRCUIT BOARD, SEMICONDUCTOR DEVICE INCLUDING THE SAME, AND MANUFACTURING METHOD THEREOF

BACKGROUND

Contemporary high performance computing systems consisting of one or more electronic devices are widely used in a variety of advanced electronic applications. When integrated circuit components or semiconductor chips are packaged for these applications, one or more chip packages are generally bonded to a circuit carrier (e.g., a system board, a printed circuit board, or the like) for electrical connections to other external devices or electronic components. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1K are schematic cross-sectional views of structures produced at various stages of a manufacturing method of a semiconductor device according to some embodiments of the present disclosure.

DETAILED DESCRIPTION

Figure 1C:
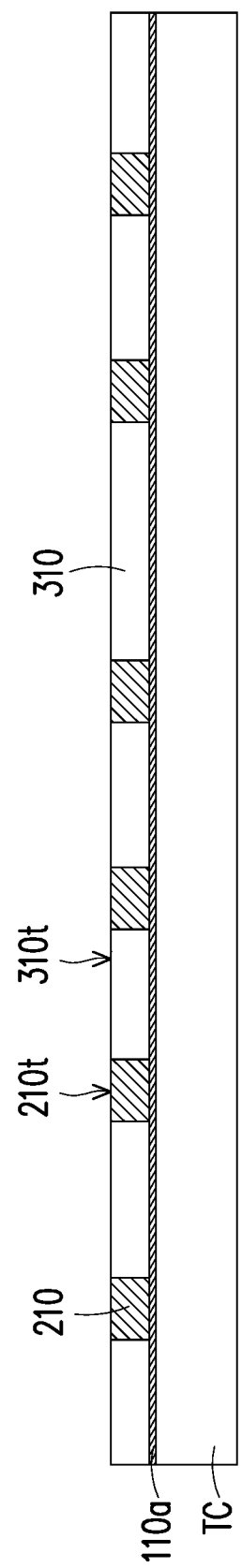

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A through FIG. 1K are schematic cross-sectional views of structures produced at various stages of a manufacturing method of a semiconductor device 10 (shown in FIG. 1K) according to some embodiments of the present disclosure. Referring to FIG. 1A, a temporary carrier TC is provided. In some embodiments, the temporary carrier TC is a glass substrate, a metal plate, a plastic supporting board or the like, but other suitable substrate materials may be used as long as the materials are able to withstand the subsequent steps of the process. In some embodiments, a de-bonding layer (not shown) is provided on the temporary carrier TC to facilitate peeling the temporary carrier TC away from the manufacturing intermediate when required by the manufacturing process. In some embodiments, the de-bonding layer includes a light-to-heat conversion (LTHC) release layer.

In some embodiments, a seed material layer 110a is formed over the temporary carrier TC (and the de-bonding layer, if included). In some embodiments, the seed material layer 110a promotes the deposition of a first thermally conductive layer 270 during later steps of the manufacturing process. In some embodiments, a material of the seed material layer 110a includes a thermally conductive material. The material of the seed material layer 110a may include copper, aluminum, platinum, nickel, titanium, tantalum, chromium, gold, silver, tungsten, a combination thereof, or the like. In some embodiments, the seed material layer 110a is formed by sputtering, physical vapor deposition (PVD), chemical vapor deposition (CVD) or any other suitable technique.

An auxiliary mask M1 may be provided over the temporary carrier TC and the seed material layer 110a. In some embodiments, the auxiliary mask M1 is patterned so as to cover only part of the seed material layer 100a. The auxiliary mask M1 may include openings O1 through which portions of the seed material layer 110a are exposed. In some embodiments, the auxiliary mask M1 is produced on the temporary carrier TC by a sequence of deposition, photolithography and etching. A material of the auxiliary mask M1 may include a positive photoresist or a negative photoresist.

Referring to FIG. 1A and FIG. 1B, first via sections 210 of the through vias 200 (shown in FIG. 1G) may be formed over the exposed portions of the seed material layer 100a. In some embodiments, conductive material (not shown) may be disposed into the openings O1 of the auxiliary mask Ml. Thereafter, the auxiliary mask M1 may be removed, leaving the first via sections 210 over the seed material layer 110a. Upon removal of the auxiliary mask Ml, parts of the seed material layer 110a which are not covered by the first via sections 210 may be exposed. In some embodiments, the first via sections 210 may be formed by a plating process. The plating process may include, for example, electro-plating, electroless-plating, immersion plating, or the like. In some embodiments, the conductive material includes copper, aluminum, nickel, gold, silver, tungsten a combination thereof, or the like. In some embodiments, the auxiliary mask M1 is removed or stripped through etching, ashing, or other suitable removal processes.

In some embodiments, referring to FIG. 1C, the first via sections 210 are laterally wrapped by a first core dielectric layer 310. In some embodiments, top surfaces 210t of the first via sections 210 are exposed by the first core dielectric layer 310. In some embodiments, the top surfaces 210t of the first via sections 210 are substantially coplanar with the top surface 310t of the first core dielectric layer 310. A material of the first core dielectric layer 310 is not particularly limited, and may include molding compound, Ajinomoto build-up film, polymeric materials (e.g., polyimide, polyesters, benzocyclobutene, polybenzoxazole, or the like), prepreg, resin coated copper (RCC), photo image dielectric (PID), phenolic paper, phenolic cotton paper, woven fiberglass cloth, impregnated woven fiberglass cloth, or a combination thereof. In some embodiments, the first core dielectric layer 310 is formed by molding, lamination, or other suitable techniques. In some embodiments, the first core dielectric layer 310 is formed by compression molding. In some embodiments, formation of the first core dielectric layer 310 includes overmolding the first core dielectric layer 310 over the first via portions 210. That is, the first via sections 210 may be initially covered by the first core dielectric layer 310, and exposed following a planarization step. In some embodiments, the planarization step includes chemical mechanical polishing (CMP), grinding, or the like.

Figure 1D:
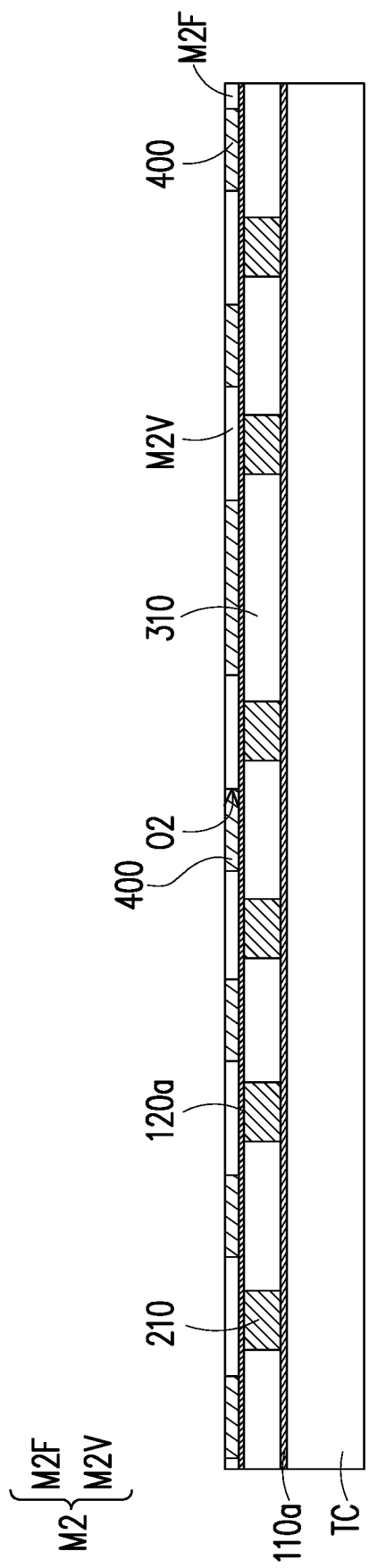

In some embodiments, referring to FIG. 1D, a seed material layer 120a is formed over the first via portions 210 and the first core dielectric layer 310. A material and a fabrication method of the seed material layer 120a may be analogous to the material and fabrication method described for the seed material layer 110a, and a detailed description thereof is omitted for the sake of brevity. The seed material layer 110a and the seed material layer 120a may include different materials and be produced following different process steps. In some alternative embodiments, the seed material layer 110a and the seed material layer 120a include the same material.

An auxiliary mask M2 may be disposed over the seed material layer 120a. The auxiliary mask M2 may present a pattern including openings O2 exposing portions of the seed material layer 120a. In some embodiments, the auxiliary mask M2 covers the first via sections 210, exposing only portions of the seed material layer 120a extending over the first core dielectric layer 310. In some embodiments, the auxiliary mask M2 includes a frame part M2F running over an edge 310E of the first dielectric layer and via masks M2V disposed within the frame part M2F over the first via sections 210. In some embodiments, a span of the via masks M2V is larger than a span of the first via portions 210. The via masks M2V may be isolated from each other and from the frame part M2F. The auxiliary mask M2 may include similar materials and be formed following similar processes as described above for the auxiliary mask M1.

A patterned conductive plate 400 may be formed in the openings O2 of the auxiliary mask M2. The patterned conductive plate 400 may be formed by filling the openings O2 with a conductive material. In some embodiments, the conductive material includes copper, aluminum, nickel, titanium, tantalum, a combination thereof, or the like. In some embodiments, the material of the patterned conductive plate 400 is a good thermal conductor, having a value of the thermal conductivity in the range from 30 W/mK to 450 W/mK. In some embodiments, the patterned conductive plate 400 may be formed by a plating process. The plating process may include, for example, electro-plating, electroless-plating, immersion plating, or the like.

Figure 1E:
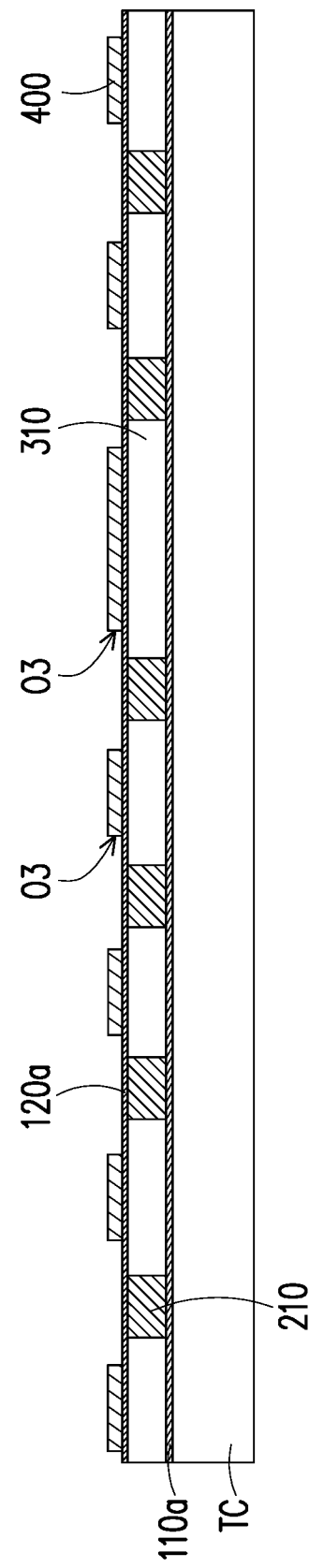
Figure 1F:
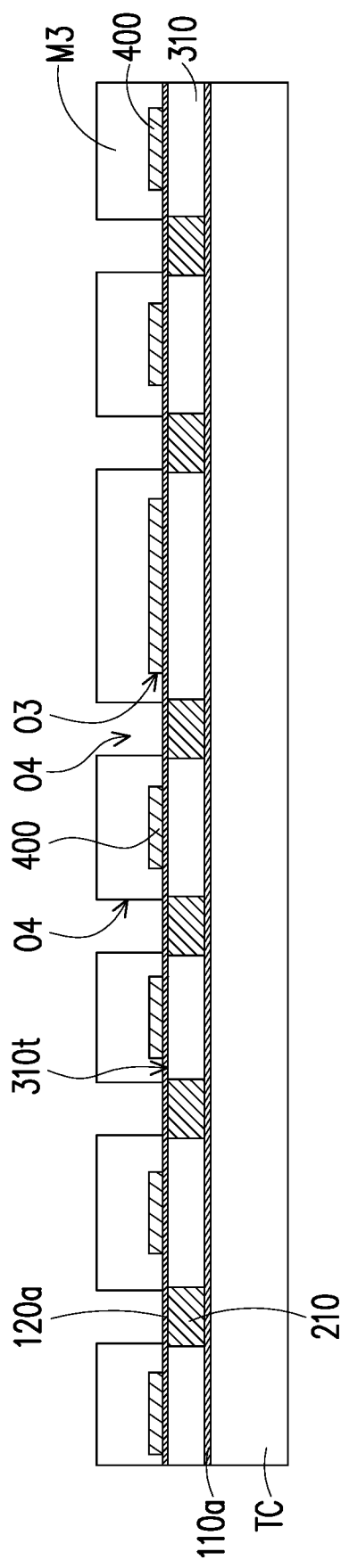

In some embodiments, referring to FIG. 1D and FIG. 1E, the auxiliary mask M2 is removed, exposing the underlying portions of the seed material layer 120a through openings O3 of the patterned conductive plate 400. In some embodiments, the openings O3 in the patterned conductive plate 400 are located where the via masks M2V were previously disposed. The openings O3 may expose the portions of the seed material layer 120a overlying the first via sections 210 and portions of the first core dielectric layer 310 adjacent to the first via sections 210. Referring to FIG. 1E and 1F, an auxiliary mask M3 is provided over the first core dielectric layer 310. In some embodiments, the auxiliary mask M3 covers the patterned conductive plate 400, and further extends to cover the edges of the openings O3. The auxiliary mask M3 may include opening O4 exposing portions of the seed material layer 120a overlying the first via sections 210. In some embodiments, the openings O4 expose only portions of the seed material layer 120a overlying the first via sections 210. When viewed from the top, a span of the openings O4 may fall completely within a span of the openings O3 and over a span of the first via sections 210.

Figure 1G:
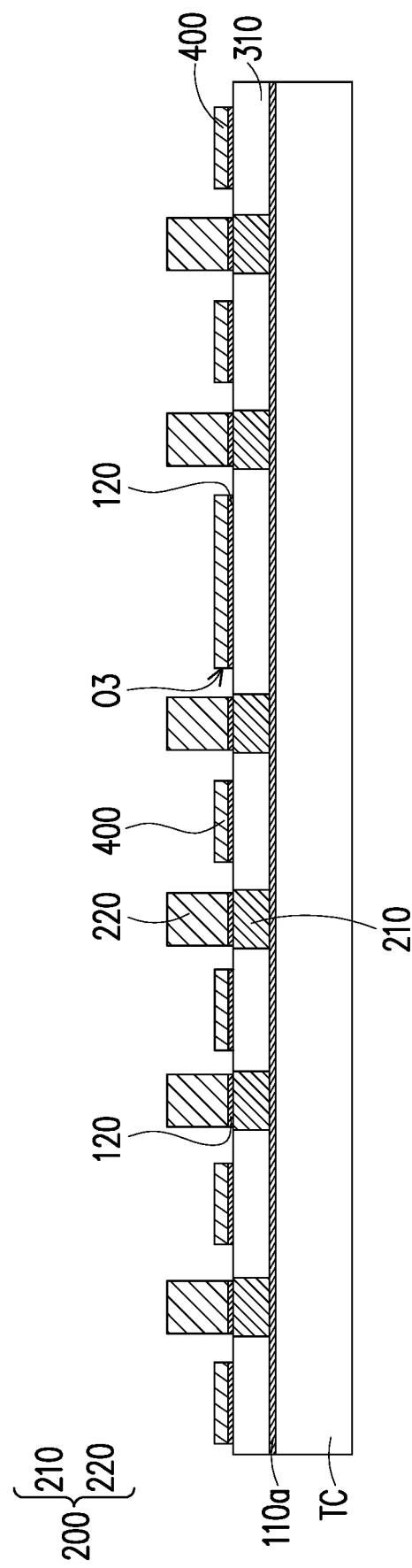

Referring to FIG. 1F and FIG. 1G, second via portions 220 of the through vias 200 may be formed over the first via portions 210. In some embodiments, the second via portions 220 are formed by filling the openings O4 of the auxiliary mask M3 with a conductive material (not shown). In some embodiments, the size or span of the second via portion 220 may be smaller than the size or span of the correspondingly undelying first via portion 210. In some embodiments, the second via portions 220 are taller than the patterned conductive plate 400. In some embodiments, the second via portions 220 and the first via portions 210 may include the same conductive material. In some embodiments, the second via portions 220 and the patterned conductive plate 400 may include the same conductive material. In some alternative embodiments, different materials may be used for the second via portions 220, the first via portions 210 and the patterned conductive plate 400. In some embodiments, the seed material layer 120a promotes the formation of both the patterned conductive plate 400 and the second via portions 220. After forming the second via portions 220 in the openings O4, the auxiliary mask M3 may be removed, exposing underlying portions of the seed material layer 120a. The portions of the seed material layer 120a revealed by the auxiliary mask M3, which are the portions that are not covered by the second via portions 220 or by the patterned conductive plate 400, may be removed, leaving a seed layer 120 sandwiched between the second via portions 220 and the first via portions 210, and between the patterned conductive plate 400 and the first core dielectric layer 310. In some embodiments, the material of the seed material layer 120a may be different from the material of the second via portions 220 and the material of the patterned conductive plate 400, so that the seed layer 120 may be formed from the seed material layer 120a via selective etching, without significantly affecting the second via portions 220 and the patterned conductive plate 400.

Figure 1H:
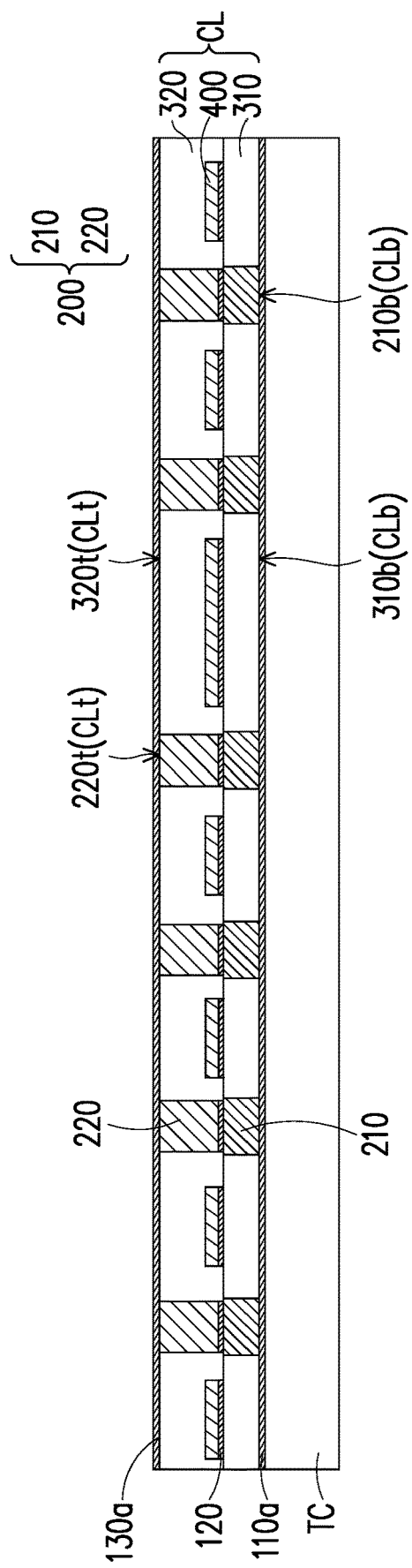

In some embodiments, referring to FIG. 1H, a second core dielectric layer 320 is provided wrapping the second via portions 220 and covering the patterned conductive plate 400. In some embodiments, the first core dielectric layer 310, the second core dielectric layer 320, the through vias 200, and the patterned conductive plate 400 are collectively referred to as core layer CL. In some embodiments, the second via portions 220 are exposed by the second core dielectric layer 320. In some embodiments, top surfaces 220t of the second via portions 220 are substantially coplanar with a top surface 320t of the second core dielectric layer 320. The top surfaces 220t of the second via portions 220 and the top surface 320t of the second core dielectric layer 320 may be considered as forming a top surface CLt of the core layer CL. Similarly, the bottom surface 310b of the first dielectric layer 310 and the bottom surfaces 210b of the first conductive vias 210 may be considered as forming a bottom surface CLb of the core layer CL. In some embodiments, the second core dielectric layer 320 includes similar materials and is provided with similar process steps as previously described for the first core dielectric layer 310. In some embodiments, the second core dielectric layer 320 is laminated over the first core dielectric layer 310. In some alternative embodiments, the second core dielectric layer 320 is formed by overmolding. In some embodiments, formation of the second core dielectric layer 320 includes a planarization step removing portions of the second core dielectric layer 320 until the top surfaces 220t of the second via portions 220 are exposed. In some embodiments, a seed material layer 130a is formed over the top surface 320t of the second core dielectric layer 320 and the top surfaces 220t of the second via portions 220. In some embodiments, the seed material layer 130a includes similar materials and is provided with similar process steps as previously described for the seed material layer 110a.

Figure 1I:
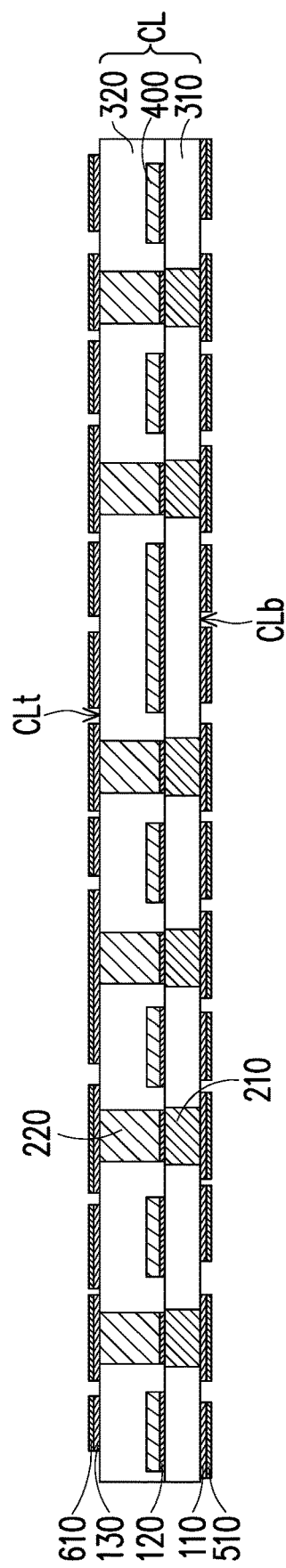

In some embodiments, referring to FIG. 1H and FIG. 1I, the temporary carrier TC is removed. In some embodiments, if the de-bonding layer (e.g., a LTHC release layer) is included, the de-bonding layer is irradiated with a UV laser so that the carrier TC and the de-bonding layer are easily peeled off from the core layer CL. Nevertheless, the de-bonding process is not limited thereto, and other suitable de-bonding methods may be used in some alternative embodiments. In some embodiments, conductive material layers (not shown) are formed over the seed material layer 110a and the seed material layer 130a on opposite surfaces. The conductive material layers may be blanketly formed on the seed material layer 110a and the seed material layer 130a by plating (e.g., plating copper through electroless plating/ electrochemical plating). In some embodiments, the conductive material layers and the seed material layers 110a and 130a are patterned together to form conductive pads 510 and 610 that are located over opposite surfaces CLb and CLu of the core layer CL. Portions of the conductive material layers and portions of the seed material layers 110a and 130a may be removed using suitable lithography and etching processes or any suitable removal technique to define the seed layer 110 and the conductive pads 510 on the bottom surface CLb of the core layer CL and the seed layer 130 and the conductive pads 610 on the top surface CLt of the core layer CL. In other words, the seed layer 110 and 130 are patterned to expose portions of the first core dielectric layer 310 and the second core dielectric layer 320, respectively. A pattern of the seed layer 110 may match a pattern of the conductive pads 510, so that portions of the first core dielectric layer 310 are exposed. Similarly, a pattern of the seed layer 130 may match a pattern of the conductive pads 610, so that portions of the second core dielectric layer 320 are exposed. In some embodiments, the seed layer 110 and the conductive pads 510 are disposed over the bottom surfaces 210b of the first via portions 210, and the seed layer 130 and the conductive pads 610 are disposed over the top surfaces 220t of the second via portions 220. In some embodiments, the lithography process may include forming an auxiliary mask (not shown) over the conductive material layers blanketly formed over the seed material layers 110a and 130a, patterning the auxiliary masks to include openings (not shown) which expose regions of the conductive material layers and the underlying seed material layers 110a and 130a, removing the exposed portions of the conductive materials layers and the seed material layers 110a and 130a and then removing the auxiliary mask. The conductive material layers and the seed material layers 110a and 130a may be patterned during a subtractive etching process, which may be conducted in a single etching step or multiple etching steps. In some alternative embodiments, the auxiliary mask (not shown) may be formed on the seed material layers 110a and 130a including openings where the conductive pads 510 and 610 are formed by depositing a conductive material (not shown), followed by removal of the auxiliary mask and the underlying portions of the seed material layers 110a and 130a to form the seed layers 110 and 130 and the conductive pads 510 and 610. In some alternative embodiments, the seed material layers 110a and 130a may be formed with a suitable thickness to act as contact pads for the build-up stacks successively formed, thus skipping the formation of the conductive pads 510 and 610.

Figure 1J:
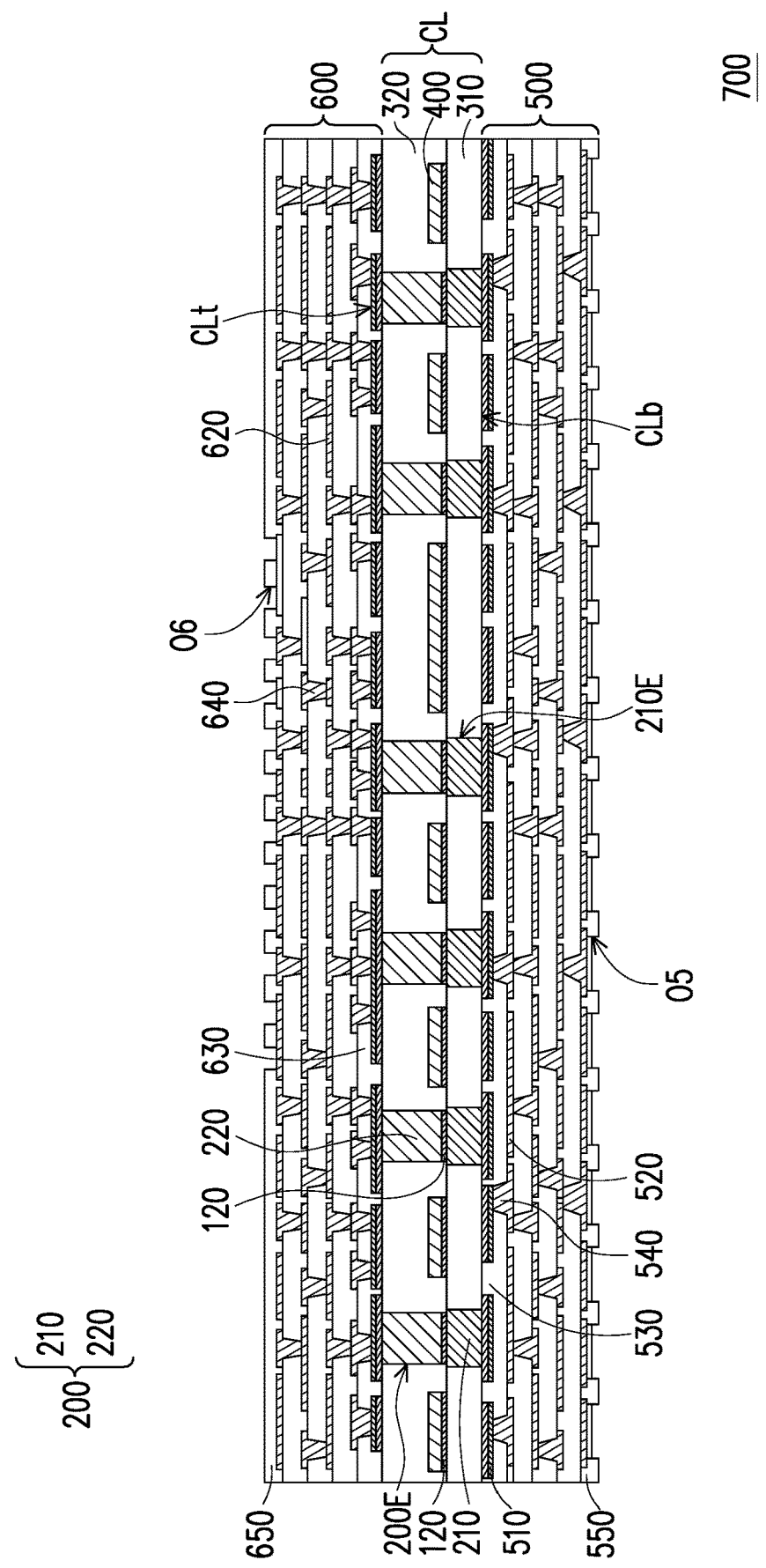

Referring to FIG. 1J, a first build-up stack 500 may be formed over the bottom surface CLb of the core layer CL, and a second build-up stack may be formed over the top surface CLt of the core layer CL. In some embodiments, the formation of the first build-up stack 500 includes sequentially forming stacked layers including conductive patterns 520 and dielectric layers 530 over the bottom surface CLb of the core layer CL. Conductive vias 540 may be provided to interconnect conductive patterns 520 belonging to different stacked layers of the first build-up stack 500. The conductive vias 540 closest to the core layer CL may establish electrical connection between the conductive pads 510 and the conductive patterns 520. Similarly, the formation of the second build-up stack 600 may include sequentially forming stacked layers including conductive patterns 620 and dielectric layers 630 over the top surface CLt of the core layer CL. Conductive vias 640 may be provided to interconnect conductive patterns 620 belonging to different stacked layers of the second build-up stack 600, and to connect the conductive patterns 620 to the conductive pads 610. Although only four layers of conductive patterns 520, 620 and four dielectric layers 530, 630 are illustrated for each of the first build-up stack 500 and the second build-up stack 600, the scope of the disclosure is not limited thereto. In other embodiments, the number of the conductive patterns 520, 620 and the number of dielectric layers 530, 630 may be adjusted based on design requirement. In some embodiments, the total number of layers of the first build-up stack 500 and the second build-up stack 600 sums up to a total of 28 to 36 layers for the conductive patterns 520, 620 and the dielectric layers 530, 630. In other words, there may be 28 to 36 layers of conductive patterns 520, 620 distributed between the first build-up stack 500 and the second build-up stack 600, and 28 to 36 dielectric layers 530, 630 distributed between the first build-up stack 500 and the second build-up stack 600. In certain embodiments, the number of layers in the first build-up stack 500 is equal to the number of layers in the second build-up stack 600. The conductive patterns 520 of the first build-up stack 500 are electrically connected to the conductive patterns 620 of the second build-up stack 600 by the through vias 200.

Referring to FIG. 1J, patterned mask layers 550 and 650 are optionally formed over the outermost dielectric layers 530, 630 of the first build-up stack 500 and the second build-up stack 600, respectively. The patterned mask layers 550, 650 may include openings O5 and O6 exposing portions of the outermost conductive patterns 520, 620 of the respective build-up stacks 500 and 600. In some embodiments, a material of the patterned mask layers 550, 650 include polymeric materials, or other suitable insulating materials. In some embodiments, the material of the patterned mask layers 550, 650 includes silica, barium sulfate, epoxy resin, a combination thereof, or the like. The materials of the patterned mask layers 550, 650 serving as solder masks may be selected to withstand the temperatures of molten conductive materials (e.g., solders, metals, and/or metal alloys) to be subsequently disposed within the openings O5, O6. In some embodiments, the patterned mask layer 550 includes different materials than the patterned mask layer 650. In some alternative embodiments, the patterned mask layers 550, 650 include the same material. The patterned mask layers 550, 650 may be formed by lamination, printing (e.g., screen printing), spin-coating or the like. Curing steps, patterning steps, or both may be required according to the materials and methods chosen for the fabrication of the patterned mask layers 550, 650. Formation of the patterned mask layers 550, 650 may complete a circuit board 700 according to some embodiments of the disclosure.

Figure 1K:
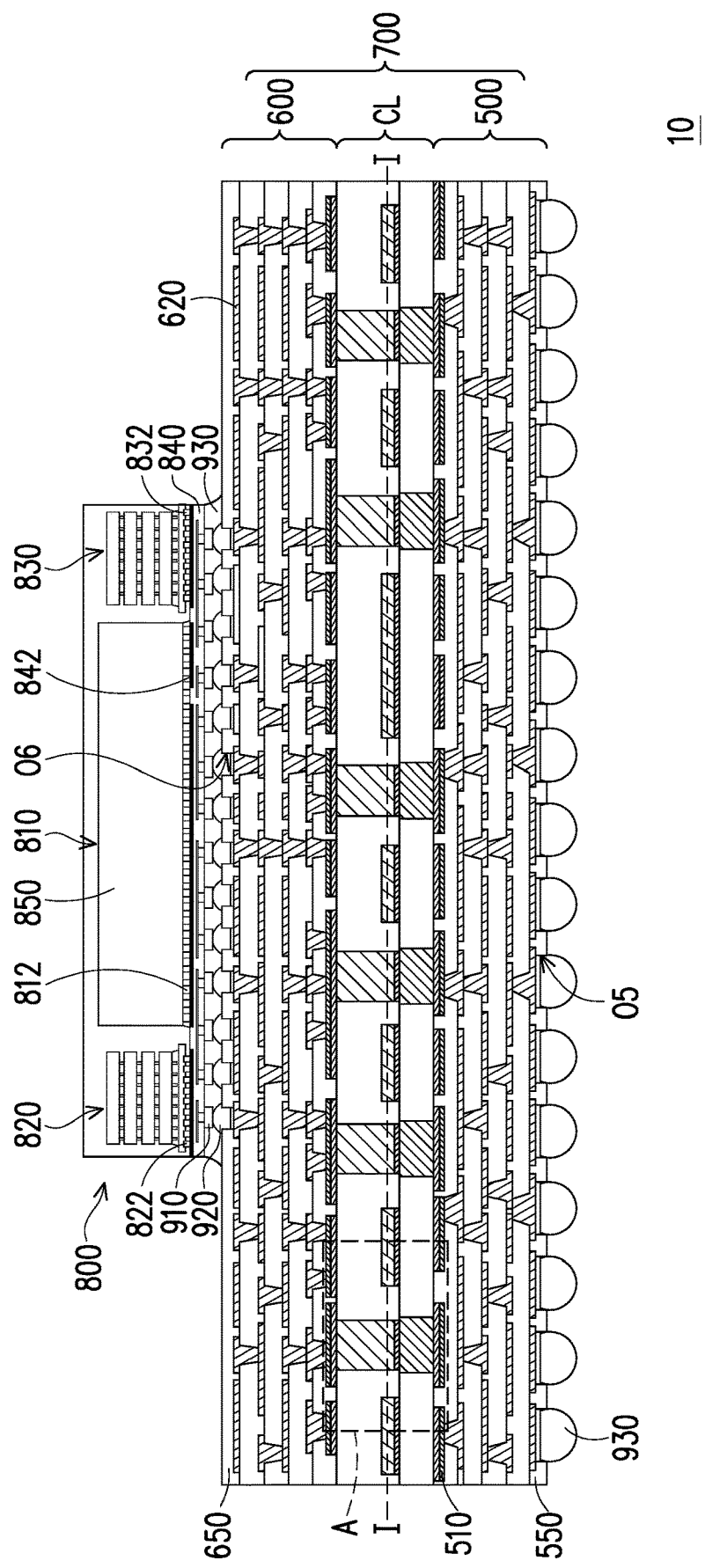

Referring to FIG. 1K, in some embodiments at least one semiconductor package 800 is connected to the printed circuit board 700 to form a semiconductor device 10. For example, the semiconductor package 800 may be connected to the top side of the printed circuit board 700 where the second build-up stack 600 is formed. The disclosure is not limited neither by the type nor the number of semiconductor packages 800 connected to the printed circuit board 700. In the drawings of the present disclosure, a Chip-on-Wafer (CoW) package is shown as the semiconductor package 800 for purpose of illustration. However, it will be apparent that other types of semiconductor packages may be used to produce semiconductor devices including the printed circuit boards disclosed herein, and all these semiconductor devices are intended to fall within the scope of the present description and of the attached claims. For example, System-On-Chip, (SoC) Integrated-Fan-Out (InFO) packages, Chip-On-Wafer-On-Substrate (CoWoS), three-dimensional integrated circuit (3DIC), Package-on-Package (PoP) systems etc. may all be used as the semiconductor packages 800, alone or in combination.

The non-limiting, exemplary package 800 shown in FIG. 1K may include semiconductor dies 810, 820, 830, bonded to an interposer 840 and encapsulated by an encapsulant 850. In some embodiments, the semiconductor dies 810, 820, 830 include semiconductor substrates having active components (e.g., transistors or the like) and optionally passive components (e.g., resistors, capacitors, inductors, or the like) formed therein. The semiconductor dies 810, 820, 830 may be connected to the interposer 840 via connectors 812, 822, 832. In some embodiments, the connectors 812, 822, 832 include copper, copper alloys, or other conductive materials, and may be formed by deposition, plating, or other suitable techniques. In some embodiments, the connectors 812, 822, 832 are prefabricated structures attached over the contact pads of the semiconductor dies 810, 820, 830. In some embodiments, the connectors 812, 814, 816 include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e. g, a metal pillar with a solder ball attached), or the like. In some embodiments, an underfill may be formed to protect the connectors 812, 814, 816 from mechanical stresses. Each of the semiconductor dies 810, 820, 830 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more of the semiconductor dies 810, 820, 830 include a memory die such as a high bandwidth memory die. In some embodiments, the semiconductor dies 810, 820, 830 may be the same type of dies or perform the same functions. In some embodiments, the semiconductor dies 810, 820, 830 may be different types of dies or perform different functions. In some embodiments, the semiconductor die 810 includes a logic die, and the semiconductor dies 820 and 830 include memory dies. In some embodiments, the semiconductor dies 820 and 830 include memory stacks, in which multiple electrically connected chips are stacked on top of each other. Generally speaking, the semiconductor package 800 may include a wide variety of devices, such as processors, resistors, capacitors, transistors, diodes, fuse devices, memories, discrete electronic devices, power coupling devices or power systems, thermal dissipation devices, combinations thereof, or the like formed therein. The interposer 840 may include conductive vias 842 formed therein to provide vertical electrical connection, allowing the semiconductor dies 810, 820, 830 to be connected to external devices (such as the circuit board 700). Some of the conductive vias 842 may electrically connect the semiconductor dies 810, 820, 830.

In some embodiments, the semiconductor package 800 may be connected to the circuit board 700 via connectors 910, 920. In some embodiments, connectors 910, 920 may be selected from similar options as previously described for the connectors 812, 814, 816. In some embodiments, the connectors 910, 920 include metals such as copper, nickel, or the like. In some embodiments, the connectors 910 are formed on the semiconductor package 800 and the connectors 920 are formed on the circuit board 700 (for example, in the openings 06 of the second build-up stack 500). The connectors 910 on the semiconductor package 800 may be jointed to the connectors 920 to provide electrical connection between the semiconductor package 800 and the circuit board 700. For example, solder paste (not shown) may be applied on either or both of the connectors 910, 920 before placing the semiconductor package 800 over the circuit board 700, and the connectors 910, 920 may be soldered together during a reflow process. In some embodiments, under-bump metallurgies (not shown) may be formed between the connectors 910 and the interposer 840 and between the connectors 920 and the portions of the conductive patterns 620 exposed by the openings O6. According to some embodiments, connectors 930 may be formed in the openings O5 of the first build-up stack 500 to allow integration of the semiconductor device 10 within larger systems (not shown).

Figure 2:
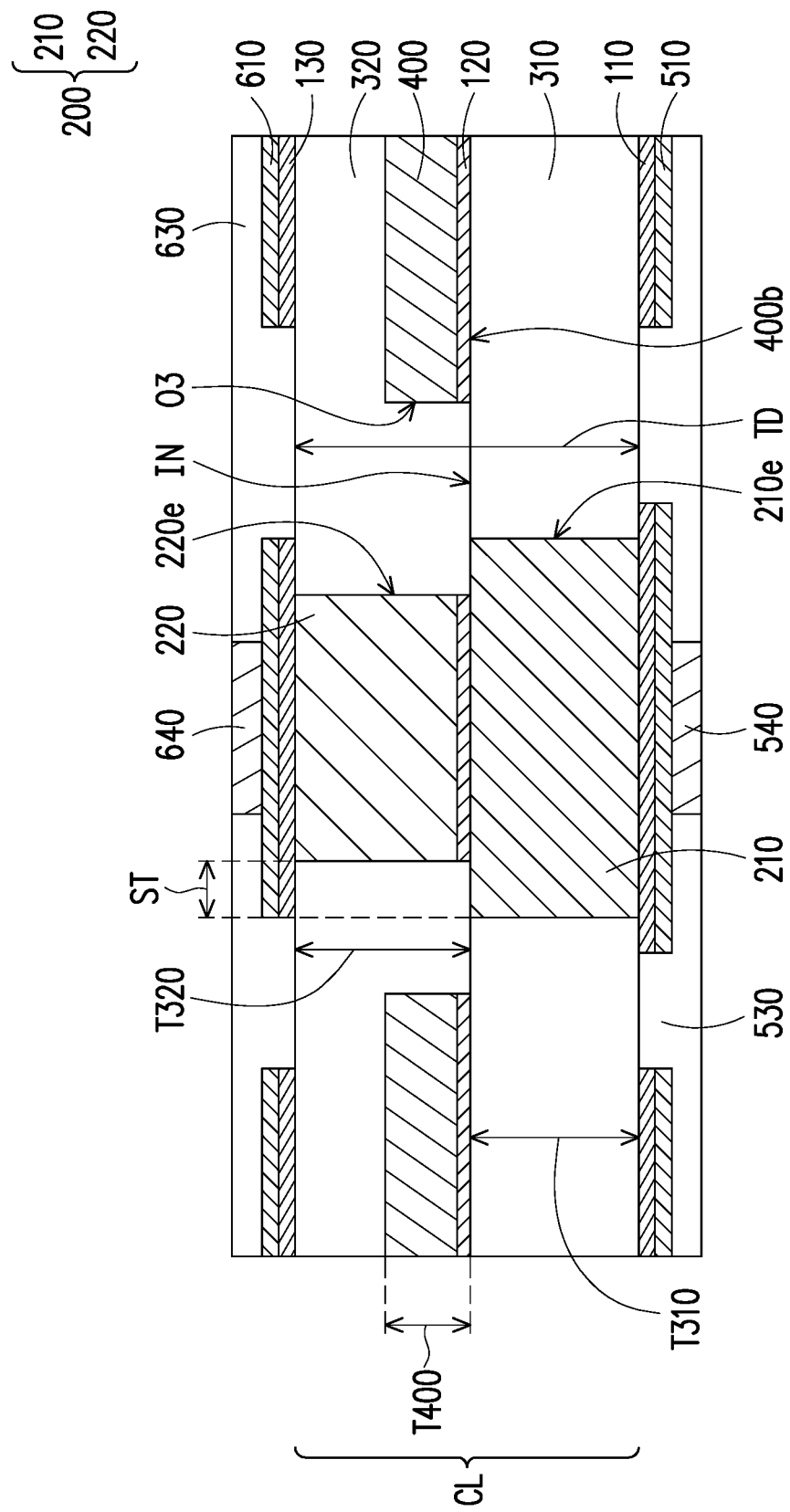
FIG. 2 is a schematic cross-sectional view of a semiconductor device according to some embodiments of the present disclosure.
Figure 3A:
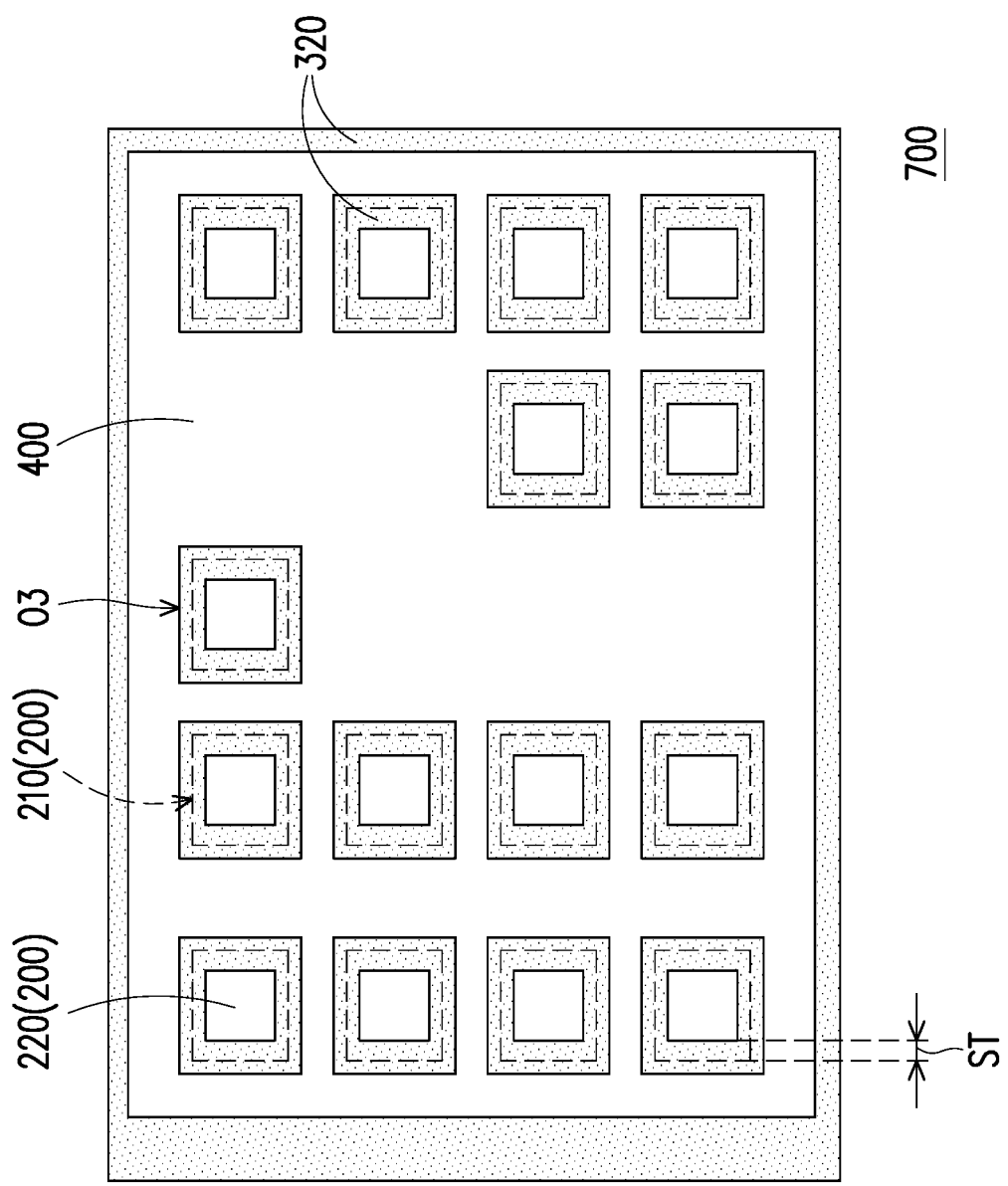
FIG. 3A and FIG. 3B are schematic cross-sectional views of circuit boards according to some embodiments of the present disclosure.

FIG. 2 shows an enlarged view of an area of the circuit board 700 according to some embodiments of the disclosure. The area shown in FIG. 2 corresponds to the area marked as A in FIG. 1K. FIG. 3A shows a schematic cross-sectional view of the circuit board 700 according to some embodiments of the disclosure. The cross-sectional view of FIG. 3A is taken in a plane normal to the plane of view illustrated in FIG. 1K, lying at the level I-I shown in FIG. 1K. The outlines of the first via portions 210 are shown in FIG. 3A to better illustrate certain aspects of the present disclosure, even though the first via portions 210 themselves do not reach the level I-I shown in FIG. 1K. In some embodiments of the present disclosure, the seed layer 120 may be considered part of the patterned conductive plate 400. Therefore, in the following description and in the appended claims, any reference to the patterned conductive plate 400 may also optionally include a reference to the seed layer

120. That is, descriptions of the patterned conductive plate 400 may refer to both embodiments in which the seed layer 120 is formed below the patterned conductive plate 400 and to embodiments in which the seed layer 120 is not formed. In some embodiments, the patterned conductive plate 400 may be a pre-fabricated plate which is disposed during the manufacturing process. Similar considerations apply for the portions of seed layer 120 formed in between the first via portions 210 and the second via portions 200. Referring to FIG. 2 and FIG. 3A, a span of the first via portions 310 may be greater than a span of the second via portions 220 (and the seed layer 120). In some embodiments, the span of the first via portions 210 is 5% to 30% greater than the span of the second via portions 220. In some embodiments, an edge 210e of the first via portions 210 is vertically misaligned with respect to an edge 220e of the second via portions 220. That is, the through vias 200 may present a step ST at the interface between the first via portions 210 and the second via portions 220 (or the seed layer 120). In some embodiments, the step ST is at a level defined by the interface IN of the first core dielectric layer 310 and the second core dielectric layer 320. In some embodiments, the presence of the step ST may result in the first via portions 210 physically contacting the second core dielectric layer 320, and the second via portions 220 not physically contacting the first core dielectric layer 310. In some embodiments, the difference in span between the first via portions 210 and the second via portions 220 may increase the manufacturing yields of the circuit board 700 by reducing the occurrence of failures due to misalignment issues during the fabrication of the first via portions 210 and the second via portions 220. In some embodiments, the presence of the step ST provides a release pathway for mechanical stress experienced by the circuit board 700, thus increasing the reliability of the semiconductor devices including the circuit board 700 (e.g., the semiconductor device 10 of FIG. 1K). In some embodiments, because the through vias 200 are filled of conductive material, the mechanical resistance of the circuit board 700 is increased. In some embodiments, the filled through vias 200 also enhance the thermal dissipation efficiency of the circuit board.

In some embodiments, a bottom surface 400b of the patterned conductive plate 400 contacts the first core dielectric layer 310, and the second core dielectric layer 320 contacts the reminaing surfaces of the patterned conductive plate 400. In some embodiments, the embedded patterned conductive plate 400 results in the circuit board 700 having a high modulus, thus enhancing the rigidity of the whole device. In some embodiments, a modulus of the core layer CL of the circuit board 700 may be tuned by adjusting the thickness T400 of the patterned conductive plate 400 with respect to the total thickness TD of the core layer CL. In some embodiments, the patterned conductive plate 400 reduces a tendency of the circuit board 700 to deform under mechanical or thermal stress (e.g., warpage during manufacturing process), thus increasing the reliability of the package and the manufacturing yields. In some embodiments, the total thickness TD of the core layer CL may me measured as the sum of the thickness T310 of the first core dielectric layer 310 and the thickness T320 of the second core dielectric layer 320, with the thicknesses T310 and T320 being measured in regions of the corresponding core dielectric layers 310, 320 in which neither the patterned conductive plate 400 nor the through vias 200 are formed. In some embodiments, the thickness T400 of the patterned conductive plate 400 is in the range from 5 µm to 200 µm. In some embodiments, the total thickness TD of the core layer CL is in the range from 50 µm to 3 mm. In some embodiments, a ratio between the thickness T310 of the first core dielectric layer 310 over the thickness T320 of the second core dielectric layer 320 is in the range from 0.5 to 5.0. In some embodiments, a bottom surface 400b of the patterned conductive plate 400 is coplanar with the interface IN between the first core dielectric layer 310 and the second core dielectric layer 320. In some embodiments, as shown in FIG. 2 and in FIG. 3A, the second core dielectric layer 320 may be partially disposed in the openings O3 of the patterned conductive plate 400, preventing shortening between the patterned conductive plate 400 and the through vias 200. Alternatively stated, the second via portions 220 may be disposed within the openings O3 and separated from the patterned conductive plate 400 by intervening portions of the second core dielectric layer 320. In some embodiments, the first core dielectric layer 310 does not extend within the openings O3. As shown in FIG. 2 and in FIG. 3A, an outline of the openings O3 may be larger than a span of the first via portions 210, so that the first core dielectric layer 310 may electrically insulate the patterned conductive plate 400 from the first via portions 210. A shape of the openings O3 and the through vias 200 may be determined with a series of patterning steps as described with reference to FIG. 1A to FIG. 1G, and, therefore, it is not particularly limited. In FIG. 3A, the first via portions 210, the second via portions 220 and the openings O3 are shown to have rectangular sections, however the disclosure is not limited thereto. In some alternative embodiments, other shapes may be used, such as other polygons (triangles, pentagons, hexagons, trapezii, rhomboids), circles, ellipsoids, or the like. Furthermore, the first via portions 210, the second via portions 220 and the openings O3 are not limited to have the same shape. In some embodiments, the openings O3 are arranged in an array on the patterned conductive plate 400. That is, adjacent openings O3 may open on the patterned conductive plate 400 keeping a regular distance along one or more directions. In some alternative embodiments, the distance of adjacent openings O3 may vary based on actual design requirements. In some embodiments, regions of the same patterned conductive plate 400 may present different arrangements of the openings O3 or distances between adjacent openings O3. For example, in a first region of the patterned conductive plate 400 the openings O3 may be disposed closer to each other, whilst in a second region of the same patterned conductive plate 400 the openings O3 may be disposed further away from each other. Furthermore, the present disclosure poses no limitation to the number of openings O3 formed on the patterned conductive plate 400, and said number may be adjusted based on product requirements.

Figure 3B:
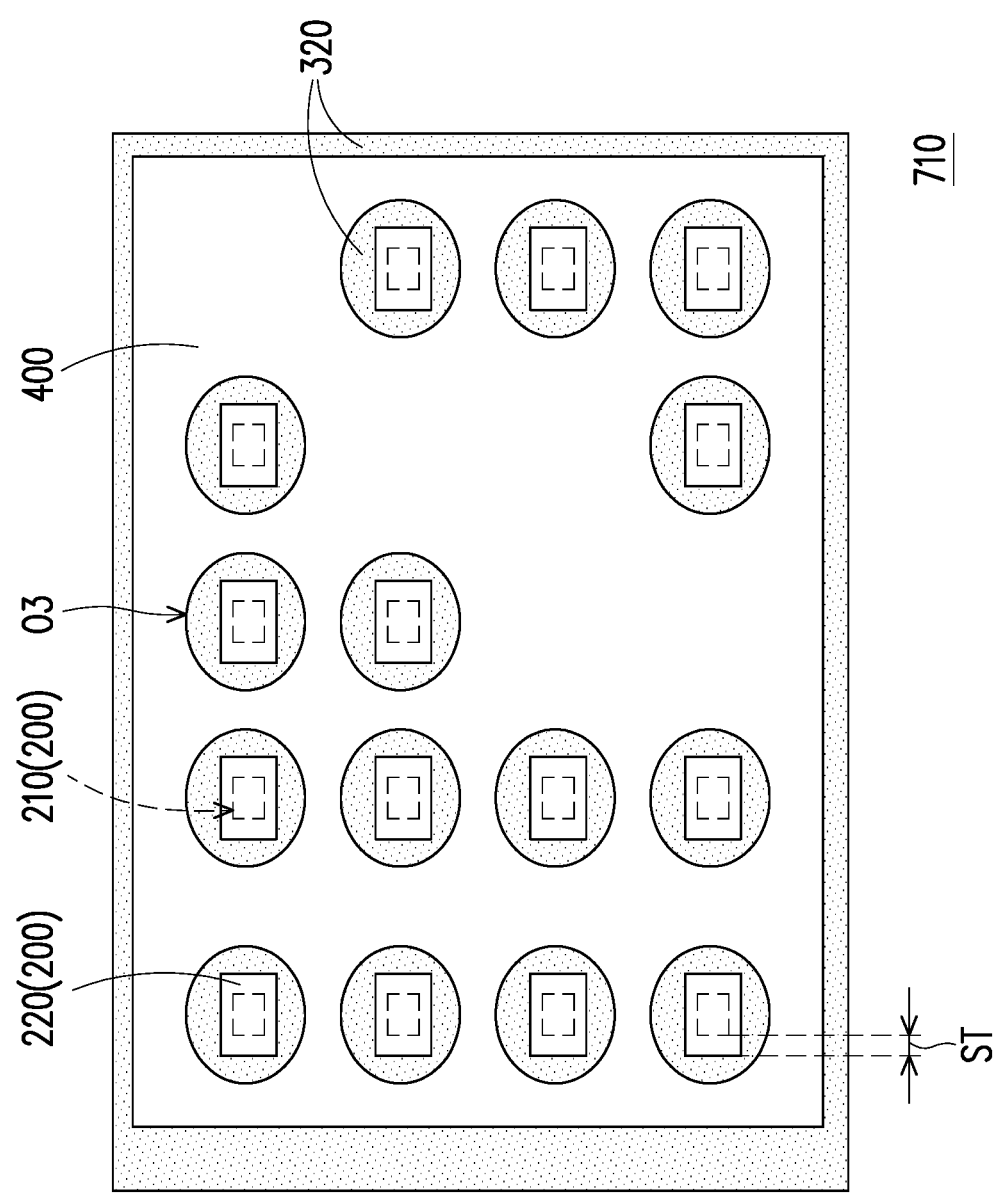

FIG. 3B is a schematic cross-sectional view of a circuit board 710 according to some embodiments of the disclosure. The schematic cross-sectional view of FIG. 3B is taken in a similar manner as described above for FIG. 3A. A difference between the circuit board 710 of FIG. 3B and the circuit board 710 of FIG. 3A is that the openings O3 have an elliptical shape rather than a rectangular shape. Furthermore, the shape of the openings O3 differs from the shape of the first via portions 210 and the second via portions 220. As shown in FIG. 3B, in some embodiments a span of the first via portions 210 may be smaller than a span of the second via portions 220. In some embodiments, the span of the second via portions 220 may be from 5% to 30% larger than the span of the first via portions 210. Alternatively stated, a step ST exists also in the through vias 200 of the circuit board 710, resulting in the first via portions 220 contacting the first core dielectric layer 310 (shown in FIG. 2) and the second via portions 220 not contacting the second core dielectric layer 320.

Figure 4:
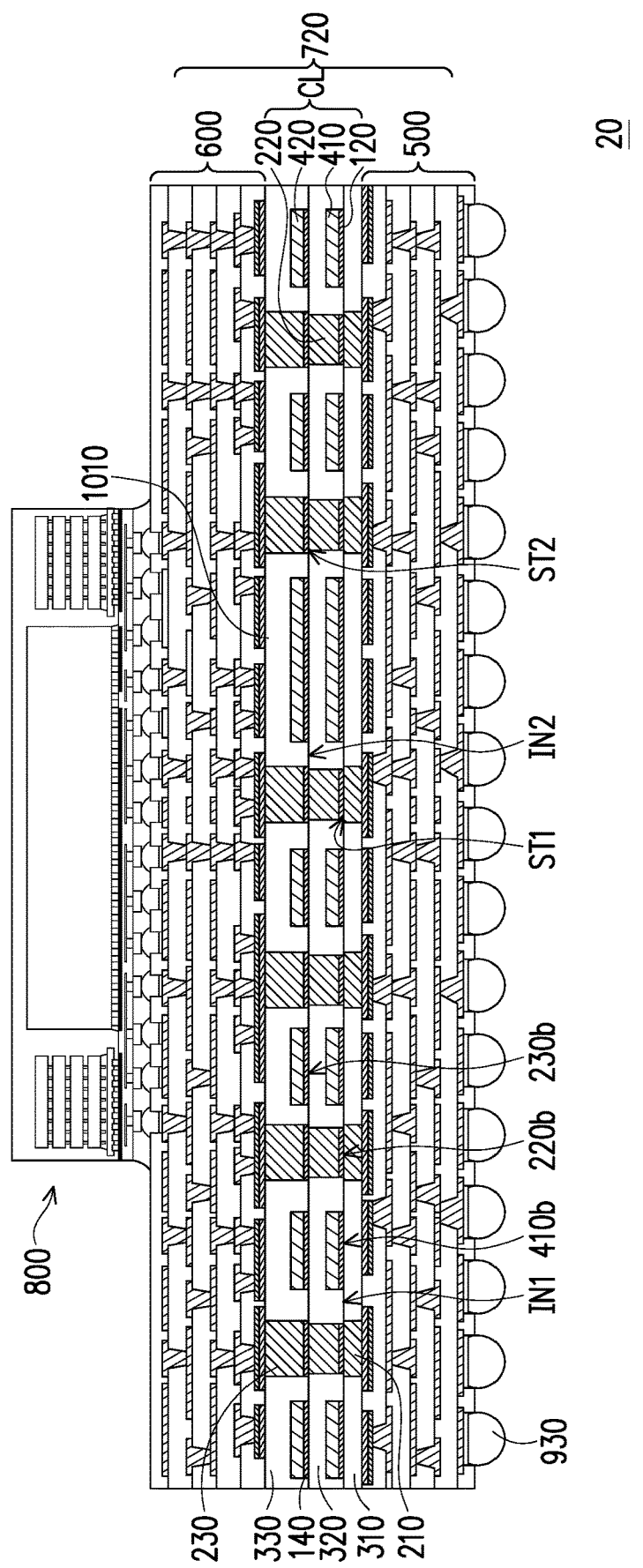
FIG. 4 is a schematic cross-sectional view of a semiconductor device according to some embodiments of the present disclosure.

In FIG. 4 is shown a cross-sectional view of a semiconductor device 20 according to some embodiments of the disclosure. The semiconductor device 20 may include the circuit board 720 and the semiconductor package 800. The semiconductor device 20 of FIG. 4 may be similar to the semiconductor device 10 of FIG. 1K, and the following description will focus on some of the differences between the two semiconductor devices 10 and 20. The circuit board 720 included in the semiconductor device 20 includes three core dielectric layers 310, 320, and 330, embedding the first via portions 210, the second via portions 220 and the third via portions 230, respectively. In some embodiments, a span of the second via portions 220 is smaller than a span of the first via portions 210 and the third via protions 230, so that steps ST1 and ST2 are formed. Because of the steps ST1 and ST2 the first via portions 210 and the third via portions 310 may physically contact the second core dielectric layer 320, whilst the second via portions 220 may not be in direct physical contact with the first core dielectric layer 310 and the third core dielectric layer 330. However, the disclosure is not limited thereto. In some alternative embodiments, a span of the third via portions 230 may be smaller than and fall entirely on a span of the second via portions 220, thus resulting in the second via portions 220 physically contacting the third core dielectric layer 330 and the third via portions 230 not contacting the second core dielectric layer 320. In some alternative embodiments, spans of the first via portions 210 and the third via portions 230 may be smaller than spans of the second via portions 220, and the first via portions 210 and the third via portions 230 may be positioned so as to physically contact the second via portions 220, but not the second core dielectric layer 320. In some embodiments, relative spans and positions of the via portions 210, 220, 230 are selected so as to define the steps ST1 and ST2. The presence of the steps ST1 and ST2 may help to release mechanical stress generated during manufacturing or usage of the semiconductor device 20.

The semiconductor device 20 may include two patterned conductive plates 410 and 420, disposed at a level of the second via portions 220 and the third via portions 230, respectively. In some embodiments, a bottom surface 410b of the first patterned conductive plate 410 is substantially coplanar with bottom surfaces 220b of the second via portions 220, and a bottom surface 420b of the second patterned conductive plate 420 is substantially coplanar with bottom surfaces 230b of the third via portions 230. That is, the bottom surface 410b of the first patterned conductive plate 410 may be substantially coplanar with the interface IN1 between the first core dielectric layer 310 and the second core dielectric layer 320, and the bottom surface 420b of the second patterned conductive plate 420 may be substantially coplanar with the interface IN2 between the second core dielectric layer 320 and the third core dielectric layer 330. In some embodiments, the patterned conductive plates 410, 420 are disposed between different pairs of core dielectric layers 310, 320, 330. That is, the first patterned conductive plate 410 is sandwiched between the first core dielectric layer 310 and the second core dielectric layer 320, and the second patterned conductive plate 420 is sandwiched between the second core dielectric layer 320 and the third core dielectric layer 330. In some embodiments, a number of core dielectric layers 310, 320, 330 is greater than the number of patterned conductive plates 410, 420 by at least one unit. That is, at least one more core dielectric layer is included than the number of patterned conductive plates 410, 420. In some embodiments, there are more via portions 210, 220, 230 than there are patterned conductive plates 410, 420. In some embodiments, the number of via portions 210, 220, 230 exceeds the number of patterned conductive plates 410, 420 by at least one unit, but the disclosure is not limited thereto. Including multiple patterned conductive plates 410, 420 in the core layer CL may reduce the total thickness required to achieve a certain rigidity of the core layer CL (as it may be required, for example, for some applications). Furthermore, inclusion of the patterned conductive plates 410, 420 may further improve the thermal dissipation of the circuit board 720. Improved electrical inductance and resistance may also be achieved. In some embodiments, the patterned conductive plates 410, 420 may span over half of the total thickness TD (shown in FIG. 2) of the core layer CL.

Figure 5:
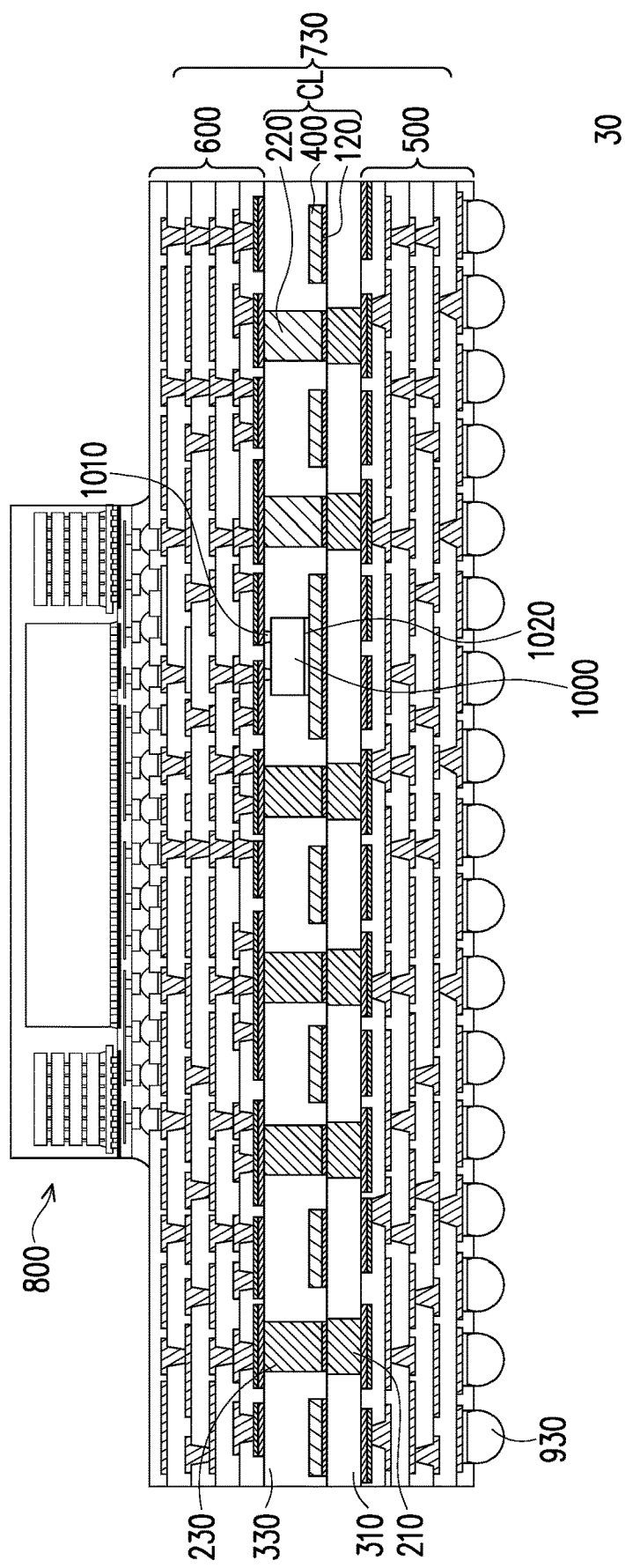
FIG. 5 is a schematic cross-sectional view of a semiconductor device according to some embodiments of the present disclosure.

In FIG. 5 is shown a cross-sectional view of a semiconductor device 30 according to some embodiments of the disclosure. The semiconductor device 30 may include the circuit board 730 and the semiconductor package 800. The semiconductor device 30 of FIG. 5 may be similar to the semiconductor device 10 of FIG. 1K, and the following description will focus on some of the differences between the two semiconductor devices 10 and 30. In some embodiments, the semiconductor device 30 includes an additional device 1000 embedded in the core layer CL and electrically connected to the semiconductor package 800 through the second build-up stack 600. The additional device 1000 may be connected to the second build-up stack 600 via connectors 1010, and be secured on the patterned conductive plate 400 via a bonding material 1020. In some embodiments, the additional device 1000 may include active components (such as transistors, etc.), passive components (resistor, capacitors, etc.), or combinations thereof. In some embodiments of the disclosure, because the dielectric layers 310, 320 may be formed via molding processes, it is possible to embed additional active or passive devices 1000 within the core layers CL, thus providing a shorter connecting path with the semiconductor package(s) 800 disposed on the circuit board. In some embodiments, the connection distance between the embedded device 1000 and the semiconductor package(s) 800 may be on the order of few hundred micrometers (e.g., 300 micrometers). The shorter connection distance may reduce the power required to drive the additional device 1000, improving the power efficiency of the whole semiconductor device 30. Furthermore, the signal to noise ratio of the signals exchanged between the additional component 1000 and the semiconductor package(s) 800 may also be improved.

In light of the foregoing, the patterned conductive plate included in the core layer of the circuit boards of the present disclosure may enhance the structural rigidity of the circuit board, thus reducing the possibility of failure because of warpage during subsequent manufacturing processes. In some embodiments, the patterned conductive plate may also enhance the thermal dissipation of the circuit board, and provide improved electrical inductance and resistance properties of the core layer. In some embodiments, as the through vias establishing double-sided communication between opposite sides of the circuit board may be filled with metal, a further increase in structural stability may also be achieved. According to some aspects of the present disclosure, active or passive components may be embedded in the core layer during the manufacturing process of the core layer, thus improving the electrical connection of these active or passive components with semiconductor packages subsequently connected to the circuit board, and increasing the power consumption efficiency of the resulting semiconductor devices.

In accordance with some embodiments of the disclosure, a structure is provided. The structure includes a core layer and a build-up stack disposed on the core layer. The core layer includes a first core dielectric layer, a second core dielectric layer, through vias, and a patterned conductive plate. The second core dielectric layer is disposed on the first core dielectric layer. The through vias cross the first core dielectric layer and the second core dielectric layer. The patterned conductive plate is disposed on the first core dielectric layer and is electrically insulated from the through vias. The build-up stack includes interconnected conductive patterns electrically connected to the through vias. A bottom surface of the patterned conductive plate is coplanar with an interface of the first core dielectric layer and the second core dielectric layer.

In accordance with some embodiments of the disclosure, a semiconductor device is provided. The semiconductor device includes a circuit board and a semiconductor package. The circuit board includes a core layer and build up stacks disposed on opposite sides of the core layer. The core layer has stacked dielectric layers, through vias, and a patterned conductive plate. The through vias are wrapped by the stacked dielectric layers. The patterned conductive plate is disposed in between two adjacent stacked dielectric layers of the stacked dielectric layers. The patterned conductive plate includes openings filled by sections of the stacked dielectric layers and sections of the through vias and is electrically isolated from the through vias. A bottom surface of the patterned conductive plate contacts the underlying layer of the two adjacent stacked dielectric layers, and the overlying layer of the two adjacent stacked dielectric layers contacts the reminaing surfaces of the patterned conductive plate. The build-up stacks include conductive patterns electrically connected to the through vias. The semiconductor package is disposed on one build-up stack and is electrically connected to the through vias.

In accordance with some embodiments of the disclosure, a manufacturing method of a circuit board is provided. The method includes at least the followings. A conductive material is deposited to form first via portions. The first via portions are wrapped in a first core dielectric layer. A patterned conductive plate is formed on the first core dielectric layer. The patterned conductive plate includes openings that expose the first via portions. A conductive material is deposited to form second via portions in the openings of the patterned conductive plate, wherein the second via portions are electrically insulated from the patterned conductive plate. The second via portions are wrapped in a second core dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
  a core layer including:
    a first core dielectric layer;
    a second core dielectric layer disposed on the first core dielectric layer;
    through vias crossing the first core dielectric layer and the second core dielectric layer; and
    a patterned conductive plate disposed on the first core dielectric layer and electrically insulated from the through vias; and
  a build-up stack disposed on the core layer, including interconnected conductive patterns electrically connected to the through vias,
  wherein the second core dielectric layer further extends on a top surface of the patterned conductive plate, a bottom surface of the patterned conductive plate is coplanar with an interface of the first core dielectric layer and the second core dielectric layer, and the patterned conductive plate is electrically insulated from the build-up stack.

2. The structure of claim 1, wherein top surfaces of the through vias are coplanar with a top surface of the second core dielectric layer.

3. The structure of claim 1, wherein the patterned conductive plate is made of copper.

4. The structure of claim 1, wherein the through vias include first via portions and second via portions disposed over the first via portions, the first via portions are embedded in the first core dielectric layer and the second via portions are embedded in the second core dielectric layer, and a bottom surface of the second via portions is coplanar with a bottom surface of the patterned conductive plate.

5. The structure of claim 4, wherein a span of one second via portion is smaller than a span of an underlying first via portion and falls entirely within the span of the underlying first via portion.

6. The structure of claim 5, wherein an edge of the first via portion is vertically misaligned with respect to an edge of the second via portion.

7. The structure of claim 1, further comprising: a semiconductor package, disposed on the build-up stack, and electrically connected to the circuit board.

8. The structure of claim 7, further comprising a semiconductor component embedded in the second core dielectric layer and electrically connected to the semiconductor package via the build-up stack.

9. A semiconductor device, comprising:
  a circuit board, including:
    a core layer having stacked dielectric layers, through vias wrapped by the stacked dielectric layers and a patterned conductive plate disposed in between two adjacent stacked dielectric layers of the stacked dielectric layers,
    wherein the patterned conductive plate includes openings filled by sections of the stacked dielectric layers and sections of the through vias and is electrically isolated from the through vias; and
    build-up stacks disposed on opposite sides of the core layer, including conductive patterns electrically connected to the through vias; and
  a semiconductor package, disposed on one build-up stack and electrically connected to the through vias,
  wherein a bottom surface of the patterned conductive plate contacts the underlying layer of the two adjacent stacked dielectric layers, the overlying layer of the two adjacent stacked dielectric layers extends within the openings of the patterned conductive plate and covers the remaining surfaces of the patterned conductive plate, and the patterned conductive plate is electrically insulated from the build-up stacks.

10. The semiconductor device of claim 9, wherein the through vias include columnar portions of metallic material presenting steps at levels defined by the interface of two adjacent stacked dielectric layers of the core layer.

11. The semiconductor device of claim 9, wherein the core layer includes multiple patterned conductive plates, each patterned conductive plate being disposed between a different pair of adjacent stacked dielectric layers than the other patterned conductive plates.

12. The semiconductor device of claim 11, wherein the number of stacked dielectric layers is greater than the number of patterned conductive plates by one.

13. The semiconductor device of claim 11, wherein each through vias include stacked portions, and the number of stacked portions in a through via is greater than the number of patterned conductive plates.

14. The semiconductor device of claim 9, wherein an outline of an opening of the patterned conductive plate has a different shape than an outline of the section of the through via disposed within the opening.

15. A manufacturing method of a circuit board, comprising:
    depositing a conductive material to form first via portions;
    forming a first core dielectric layer laterally wrapping the first via portions, wherein the first core dielectric layer is formed after the first via portions are formed;
    forming a patterned conductive plate on the first core dielectric layer, the patterned conductive plate including openings exposing the first via portions;
    depositing a conductive material to form second via portions in the openings of the patterned conductive plate, wherein the second via portions are electrically insulated from the patterned conductive plate; and
    wrapping the second via portions in a second core dielectric layer.

16. The manufacturing method of claim 15, wherein the second core dielectric layer is molded so as to encapsulate the patterned conductive plate.

17. The manufacturing method of claim 16, further comprising disposing a semiconductor component on the patterned conductive plate before wrapping the second via portions in the second core dielectric layer, wherein the semiconductor component is also wrapped by the second core dielectric layer.

18. The manufacturing method of claim 15, further comprising forming a seed material layer over the first via portions and the first core dielectric layer, wherein the patterned conductive plate and the second via portions are formed in plating steps in which the seed material layer is used for seeding.

19. The manufacturing method of claim 15, further comprising providing an auxiliary mask over the patterned conductive plate, wherein the auxiliary mask covers the first core dielectric layer and includes openings exposing portions of each first via portion.

20. The manufacturing method of claim 15, further comprising forming a first build-up structure over the first core dielectric layer, and a second build-up structure over the second core dielectric layer, wherein the first build-up structure and the second build-up structure includes layers of conductive patterns electrically connected by the through vias.

* * * * *